United States Patent
Kim et al.

(10) Patent No.: US 9,992,897 B2
(45) Date of Patent: Jun. 5, 2018

(54) DISPLAY DEVICE

(71) Applicant: Samsung Display Co., Ltd., Yongin-si, Gyeonggi-do (KR)

(72) Inventors: Minsoo Kim, Yongin-si (KR); Kinyeng Kang, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/255,026

(22) Filed: Sep. 1, 2016

(65) Prior Publication Data

US 2017/0127546 A1    May 4, 2017

(30) Foreign Application Priority Data

Nov. 2, 2015 (KR) ......................... 10-2015-0153263

(51) Int. Cl.
| | |
|---|---|
| *H05K 1/00* | (2006.01) |
| *H05K 7/14* | (2006.01) |
| *G06F 3/14* | (2006.01) |
| *H05K 5/00* | (2006.01) |
| *H05K 1/11* | (2006.01) |
| *H05K 1/02* | (2006.01) |
| *G09G 3/20* | (2006.01) |

(52) U.S. Cl.
CPC ......... *H05K 7/1427* (2013.01); *G06F 3/1446* (2013.01); *G09G 3/20* (2013.01); *H05K 1/028* (2013.01); *H05K 1/111* (2013.01); *H05K 5/0017* (2013.01); *G09G 2300/0426* (2013.01); *G09G 2380/02* (2013.01); *H05K 2201/09009* (2013.01)

(58) Field of Classification Search
CPC .... H05K 7/1427; H05K 5/0017; H05K 1/111; H05K 1/028; H05K 2201/09009; G06F 3/1446
USPC ........................................................ 361/749
See application file for complete search history.

(56) References Cited

U.S. PATENT DOCUMENTS

| | | | |
|---|---|---|---|
| 9,629,238 B2 * | 4/2017 | Lee | .................. G02F 1/133308 |
| 2004/0217702 A1 | 11/2004 | Garner et al. | |
| 2009/0184954 A1 | 7/2009 | Street | |
| 2011/0279417 A1 | 11/2011 | Kang et al. | |

(Continued)

FOREIGN PATENT DOCUMENTS

KR    10-2014-0033914 A    3/2014

*Primary Examiner* — Sherman Ng
(74) *Attorney, Agent, or Firm* — Knobbe Martens Olson & Bear LLP

(57) ABSTRACT

A display device is disclosed. In one aspect, the display device includes a first display unit including a first display area, a first left pad area outside a first left end portion of the first display area, and a first right pad area outside a first right end portion of the first display area. The first right end portion is opposite to the first left end portion. The first display unit is bent at a first portion between the first display area and the first left pad area and bent at a second portion between the first display area and the first right pad area. The first display area is bent such that the first left and right end portions are adjacent to each other, and the first left and right pad areas are located inside the first display unit. The display device also includes a first printed circuit board corresponding to both the first left and right pad areas.

20 Claims, 8 Drawing Sheets

(56) References Cited

U.S. PATENT DOCUMENTS

| | | | |
|---|---|---|---|
| 2014/0049449 A1* | 2/2014 | Park | G09G 5/00 |
| | | | 345/1.3 |
| 2014/0098040 A1* | 4/2014 | Kwon | G06F 3/01 |
| | | | 345/173 |
| 2014/0126228 A1* | 5/2014 | Lee | H05K 5/0017 |
| | | | 362/382 |
| 2014/0152646 A1 | 6/2014 | Kang et al. | |
| 2014/0307378 A1* | 10/2014 | Kang | G06F 1/1652 |
| | | | 361/679.21 |
| 2014/0307395 A1* | 10/2014 | An | G06F 1/1652 |
| | | | 361/749 |
| 2014/0355227 A1* | 12/2014 | Lim | H05K 1/028 |
| | | | 361/749 |
| 2014/0361682 A1 | 12/2014 | Cho et al. | |
| 2015/0014636 A1 | 1/2015 | Kang | |
| 2015/0102326 A1 | 4/2015 | An | |
| 2016/0128194 A1* | 5/2016 | Hong | H05K 1/147 |
| | | | 361/749 |
| 2016/0291640 A1* | 10/2016 | Seo | G09G 3/00 |
| 2016/0295176 A1* | 10/2016 | Jeong | G09G 3/00 |

* cited by examiner

DISPLAY DEVICE

CROSS-REFERENCE TO RELATED APPLICATION

This application claims the benefit of Korean Patent Application No. 10-2015-0153263, filed on Nov. 2, 2015, in the Korean Intellectual Property Office, the disclosure of which is incorporated herein in its entirety by reference.

BACKGROUND

Field

The described technology generally relates to a display device.

Description of the Related Technology

In general, a display device includes a display area and a peripheral area surrounding the display area. A typical display device has a flat shape. Furthermore, a substantially flat display device may be made flexible by the use of a flexible substrate.

SUMMARY OF CERTAIN INVENTIVE ASPECTS

One inventive aspect relates to a display device having a three-dimensional (3D) shape, which is easy to manufacture.

Another aspect is a display device that includes a first display unit including a first display area, a first left pad area outside a first left end portion of the first display area, and a first right pad area outside a first right end portion of the first display area, wherein the first right end portion is opposite to the first left end portion, and wherein the first display unit is bent at a portion between the first display area and the first left pad area and at a portion between the first display area and the first right pad area, the first display area is bent so that the first left end portion and the first right end portion are adjacent to each other, and the first left pad area and the first right pad area are located inside the first display unit; and a first printed circuit board corresponding to both of the first left pad area and the first right pad area.

The portion between the first display area and the first left pad area and the portion between the first display area and the first right pad area may be bent such that a rear surface of the first left pad area and a rear surface of the first display area face each other and a rear surface of the first right pad area and the rear surface of the first display area face each other.

The first printed circuit board may contact both of the first left pad area and the first right pad area.

The first printed circuit board may be bonded to each of the first left pad area and the first right pad area so that a state in which the first display area is bent is maintained.

The display device may further include a second display unit including a second display area, a second left pad area outside a second left end portion of the second display area, and a second right pad area outside a second right end portion of the second display area, wherein the second right end portion is opposite to the second left end portion, and wherein the second display unit is bent at a portion between the second display area and the second left pad area and at a portion between the second display area and the second right pad area, the second display area is bent so that the second left end portion and the second right end portion are adjacent to each other, and the second left pad area and the second right pad area are located inside the second display unit; and a second printed circuit board corresponding to both of the second left pad area and the second right pad area.

The portion between the second display area and the second left pad area and the portion between the second display area and the second right pad area may be bent such that a rear surface of the second left pad area and a rear surface of the second display area face each other and a rear surface of the second right pad area and the rear surface of the second display area face each other.

The second printed circuit board may contact both of the second left pad area and the second right pad area.

The second printed circuit board may be bonded to each of the second left pad area and the second right pad area so that a state in which the second display area is bent is maintained.

The first printed circuit board and the second printed circuit board may form a single body.

The display device may further include a connection unit connecting the first display unit and the second display unit, wherein the first display unit and the second display unit are arranged to maintain a first interval.

The connection unit may include a first connection unit and a second connection unit, the first connection unit and the second connection unit connecting the first display unit and the second display unit at different positions.

The first display unit may include a first substrate, the second display unit may include a second substrate, and the connection unit may include a third substrate that connects the first substrate and the second substrate.

The first substrate to the third substrate may form a single body.

First left pads electrically connected to scan lines in the first display area may be arranged in the first left pad area and first right pads electrically connected to data lines in the first display area may be arranged in the first right pad area.

Another aspect is a display device comprising: a first display unit comprising a first display area, a first left pad area outside a first left end portion of the first display area, and a first right pad area outside a first right end portion of the first display area, wherein the first right end portion is opposite to the first left end portion, wherein the first display unit is bent at a first portion between the first display area and the first left pad area and bent at a second portion between the first display area and the first right pad area, wherein the first display area is bent such that the first left and right end portions are adjacent to each other, and wherein the first left and right pad areas are located inside the first display unit; and a first printed circuit board positioned over at least a portion of both the first left and right pad areas.

In the above display device, the first and second portions are bent such that a rear surface of the first left pad area and a rear surface of the first display area face each other and a rear surface of the first right pad area and the rear surface of the first display area face each other. In the above display device, the first printed circuit board contacts both the first left and right pad areas. In the above display device, the first printed circuit board is bonded to each of the first left and right pad areas so as to maintain a state in which the first display area is bent.

The above display device further comprises: a second display unit comprising a second display area, a second left pad area outside a second left end portion of the second display area, and a second right pad area outside a second right end portion of the second display area, wherein the second right end portion is opposite to the second left end portion, wherein the second display unit is bent at a third portion between the second display area and the second left pad area and bent at a fourth portion between the second display area and the second right pad area, wherein the second display area is bent such that the second left and right end portions are adjacent to each other, and wherein the second left and right pad areas are located inside the second display unit; and a second printed circuit board positioned over at least a portion of both the second left and right pad areas.

In the above display device, the third and fourth portions are bent such that a rear surface of the second left pad area and a rear surface of the second display area face each other and a rear surface of the second right pad area and the rear surface of the second display area face each other. In the above display device, the second printed circuit board contacts both the second left and right pad areas. In the above display device, the second printed circuit board is bonded to each of the second left and right pad areas so as to maintain a state in which the second display area is bent. In the above display device, the first and second printed circuit boards form a single body. The above display device further comprises: a connection unit connecting the first and second display units, wherein the first and second display units are arranged to maintain a first interval. In the above display device, the connection unit comprises a first connection unit and a second connection unit connecting the first and second display units at different positions.

In the above display device, the first display unit comprises a first substrate, wherein the second display unit comprises a second substrate, and wherein the connection unit comprises a third substrate that connects the first substrate and the second substrate. In the above display device, the first, second and third substrates form a single body. The above display device further comprises: a plurality of first left pads electrically connected to scan lines in the first display area arranged in the first left pad area and a plurality of first right pads electrically connected to data lines in the first display area arranged in the first right pad area.

Another aspect is a display device comprising: a first display unit comprising a first display area, a first left pad area and a first right pad area, wherein the first display area has a first partially cone shape and configured to display a first image in 360 degrees, and wherein the first left and right pad areas contact each other and are located at an inner surface of the first display area; and a first printed circuit board connected to the first left and right pad areas.

In the above display device, the first printed circuit board directly contacts both the first left and right pad areas. The above display device further comprises: a second display unit comprising a second display area, a second left pad area and a second right pad area, wherein the second display area has a second partially cone shape and is smaller than the first display area, wherein the second display area is configured to display a second image in 360 degrees, wherein the second left and right pad areas contact each other and are located at an inner surface of the second display area, and wherein a bottom portion of the second display unit is connected to a top portion of the first display unit such that the combined first and second display units have a substantially cone shape; and a second printed circuit board connected to the first left and right pad areas.

In the above display device, the second printed circuit board directly contacts both the second left and right pad areas. The above display device further comprises: a connector connecting the first and second display units such that the bottom portion of the second display unit does not directly contact the top portion of the first display unit. In the above display device, the first and second images are different from each other.

DETAILED DESCRIPTION OF CERTAIN INVENTIVE EMBODIMENTS

Figure 1:
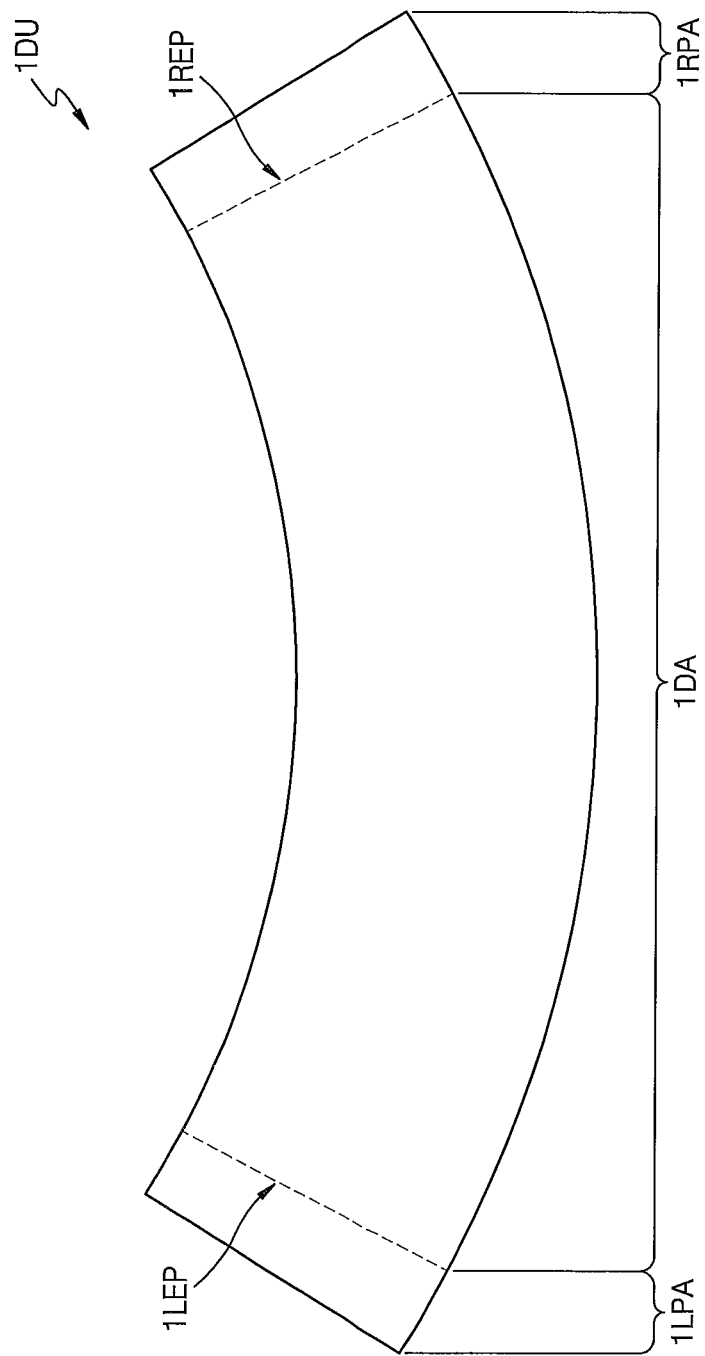
FIG. 1 is a plan view schematically illustrating an intermediate product during manufacture of a display device according to an embodiment.

A typical flexible display device is not configurable for a continuously curved folded shape. This shape enables multiple viewers located at different positions around the display device to simultaneously see a portion of the display surface.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "substrate base" includes any and all combinations of one or more of the associated listed items. Expressions such as "at least one of," when preceding a list of elements, modify the entire list of elements and do not modify the individual elements of the list.

As the inventive concept allows for various changes and numerous embodiments, embodiments will be illustrated in the drawings and described in detail in the written description. However, this is not intended to limit the present inventive concept to particular modes of practice, and it is to be appreciated that all changes, equivalents, and substitutes that do not depart from the spirit and technical scope of the present inventive concept are encompassed in the present inventive concept. In the description of the present inventive concept, certain detailed explanations of the related art are omitted when it is deemed that they may unnecessarily obscure the essence of the inventive concept.

Furthermore, sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In this disclosure, the term "substantially" includes the meanings of completely, almost completely or to any significant degree under some applications and in accordance with those skilled in the art. Moreover, "formed, disposed over positioned over" can also mean "formed, disposed or positioned on." The term "connected" includes an electrical connection.

Figure 2:
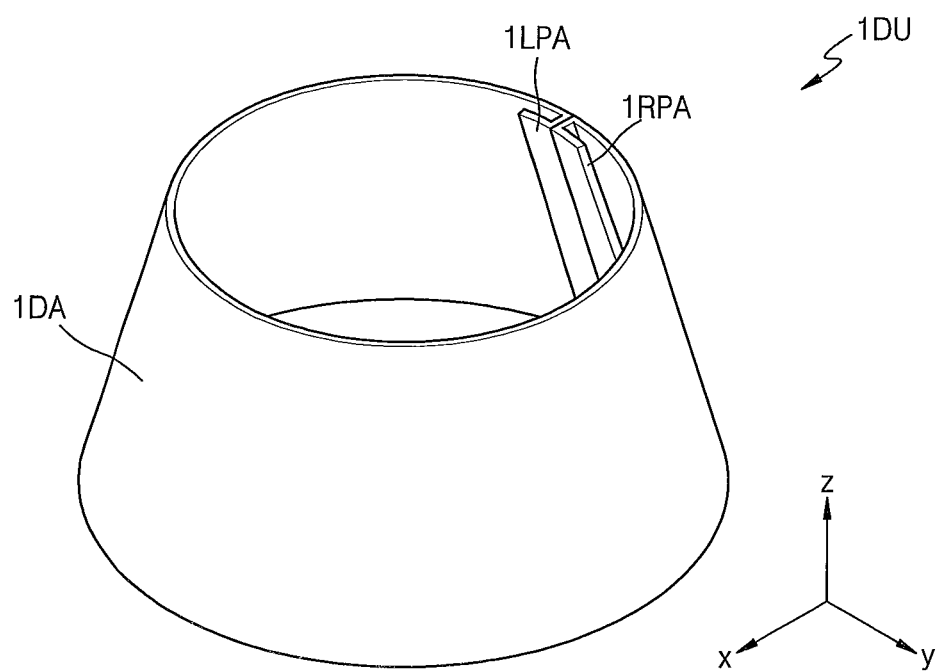
FIG. 2 is a perspective view schematically illustrating a display device according to an embodiment, which is manufactured using the intermediate product of FIG. 1.
Figure 3:
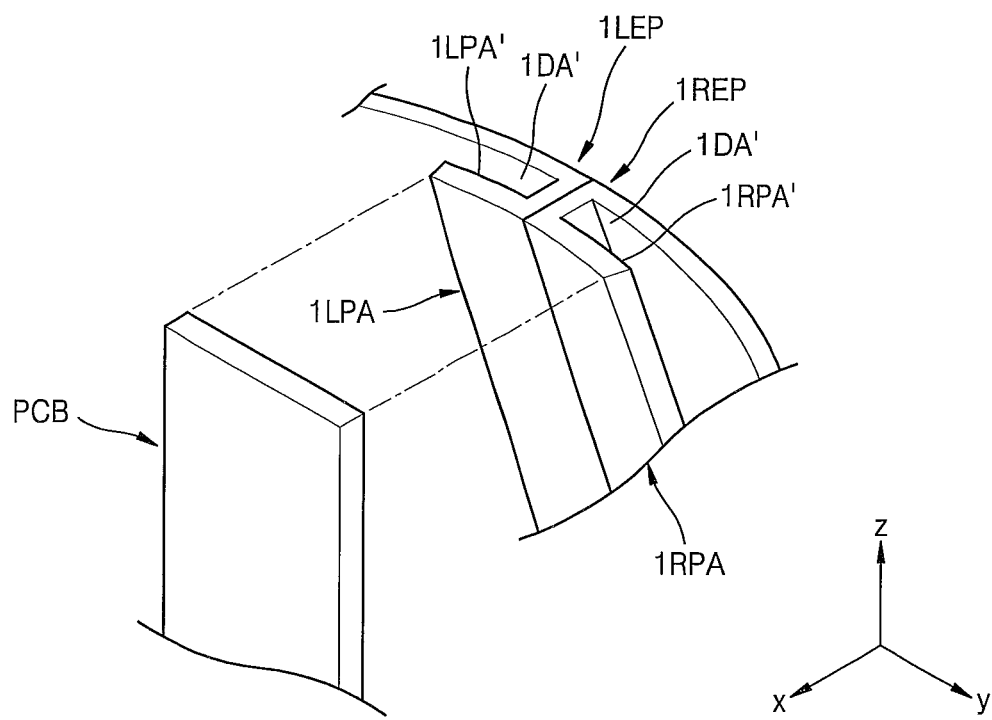
FIG. 3 is a perspective view schematically illustrating part of the display device of FIG. 2.

FIG. 1 is a plan view schematically illustrating an intermediate product during manufacture of a display device according to an embodiment. FIG. 2 is a perspective view schematically illustrating a display device according to an embodiment, which is manufactured using the intermediate product of FIG. 1. FIG. 3 is a perspective view schematically illustrating part of the display device of FIG. 2. As illustrated in FIGS. 1 to 3, the display device according to the present embodiment may include a first display unit 1DU and a first PCB.

The 1DU may include a first display area 1DA, a first left pad area 1LPA, and a first right pad area 1RPA. The 1DA displays an image. The 1DU may include various display devices such as an organic light-emitting device, a liquid crystal display device, or an electrophoretic device. The entire surface of the 1DA may display an image and only part of the 1DA may display an image. For example, the 1DA may display an image around a first left end portion 1LEP and also around a first right end portion 1REP at the opposite to the 1LEP. An image may not be displayed around each of an upper end portion and a lower end portion that connect the 1LEP and the 1REP.

The 1LPA is located outside the 1LEP of the 1DA. The 1RPA is located outside the 1REP at the opposite side of the 1LEP of the 1DA. Pads for receiving external electric signals to be applied to the 1DA may be located in the 1LPA and the 1RPA.

As such, the 1DU has a bent shape as illustrated in FIGS. 1 to 3. In some embodiments, the 1DU is bent between the 1DA and the 1LPA, and the 1DA and the 1RPA. As the 1DA is bent, the 1LEP and the 1REP of the 1DA are adjacent to each other and the 1LPA and the 1RPA are located inside the 1DU.

A substrate of the 1DU may include a polymer material such as a plastic film having flexibility. In detail, the substrate of the 1DU may include, for example, polyimide (PI), polycarbonate (PC), polyethersulphone (PES), polyethylene terephthalate (PET), polyethylenenaphthalate (PEN), polyarylate (PAR), or fiber glass reinforced plastic (FRP).

The 1DU may be bent at least twice at portions between the 1DA and the 1LPA, and between the 1DA and the 1RPA, as illustrated in FIG. 3. Accordingly, a rear surface 1LPA' of the 1LPA and a rear surface 1DA' of the 1DA face each other. Likewise, a rear surface 1RPA' of the 1RPA and the 1DA' of the 1DA may face each other.

The first PCB corresponds to both the 1LPA and the 1RPA, as illustrated in FIG. 3. Although FIG. 3 illustrates that the width of first PCB in a y-axis direction is the same as the sum of the width of the 1LPA and the width of the 1RPA, the present disclosure is not limited thereto. For example, the width of the first PCB in the y-axis direction may be greater than the sum of the width of the 1LPA and the width of the 1RPA. In any case, the first PCB corresponds to both the 1LPA and the 1RPA.

As such, the display device according to the present embodiment has a three-dimensional (3D) shape in a 3D space, unlike a typical display device (not necessarily prior art). Accordingly, the display device having a 3D shape may be embodied so that viewers located at various positions may simultaneously see a 3D-shaped display surface (not shown) of the display device. For example, in the 1DU, since the 1LPA and the 1RPA displaying no image are located inside the 1DU, the viewers outside the 1DU may not see the 1LPA and the 1RPA. Furthermore, as the 1DA is bent to allow the 1LEP and the 1REP of the 1DA to be adjacent to each other, the outside viewers see only the 1DA. Accordingly, the outside viewers may recognize only the 1DA displaying an image roughly around 360 degrees. Accordingly, a display device having a 3D shape, which is easy to manufacture, may be embodied.

In some embodiments, the display device is not manufactured in a 3D shape from the beginning. The display device having a 3D shape as illustrated in FIG. 2 is manufactured by manufacturing the 1DU that is flat and flexible as illustrated in FIG. 1 and bending part of the 1DU. Accordingly, as a process of forming a display device has no big difference from a process of manufacturing a typical flat display device, the display device having a 3D shape may be embodied by an easy manufacturing method.

Various electrical signals may be applied to the 1DA. For example, a scan signal or a data signal is applied to the 1DA. The scan signal or the data signal may be generated by a driver IC (not shown) and applied to the 1DA. To this end, the driver IC is mounted on the first PCB and a signal from the driver IC is transferred to the 1LPA and the 1RPA located inside the 1DU having a 3D shape, via the first PCB, so as to be applied to the 1DA. The first PCB may contact both the 1LPA and the 1RPA. In this case, since the first PCB is also located inside the 1DU, the outside viewers may recognize only the 1DA displaying an image roughly around 360 degrees.

When the display device having a 3D shape as illustrated in FIG. 2 is manufactured by manufacturing the 1DU that is flat and flexible and bending part of the 1DU, the 1DU needs to maintain the shape as illustrated in FIG. 2. Such a function may be handled by the first PCB.

In other words, the first PCB may be bonded to the 1LPA and the 1RPA. The first PCB may include, for example, an anisotropic conductive film (ACF). As such, as the first PCB is bonded to each of the 1LPA and the 1RPA, a state in which the 1DA is bent may be maintained as illustrated in FIG. 2.

Figure 4:
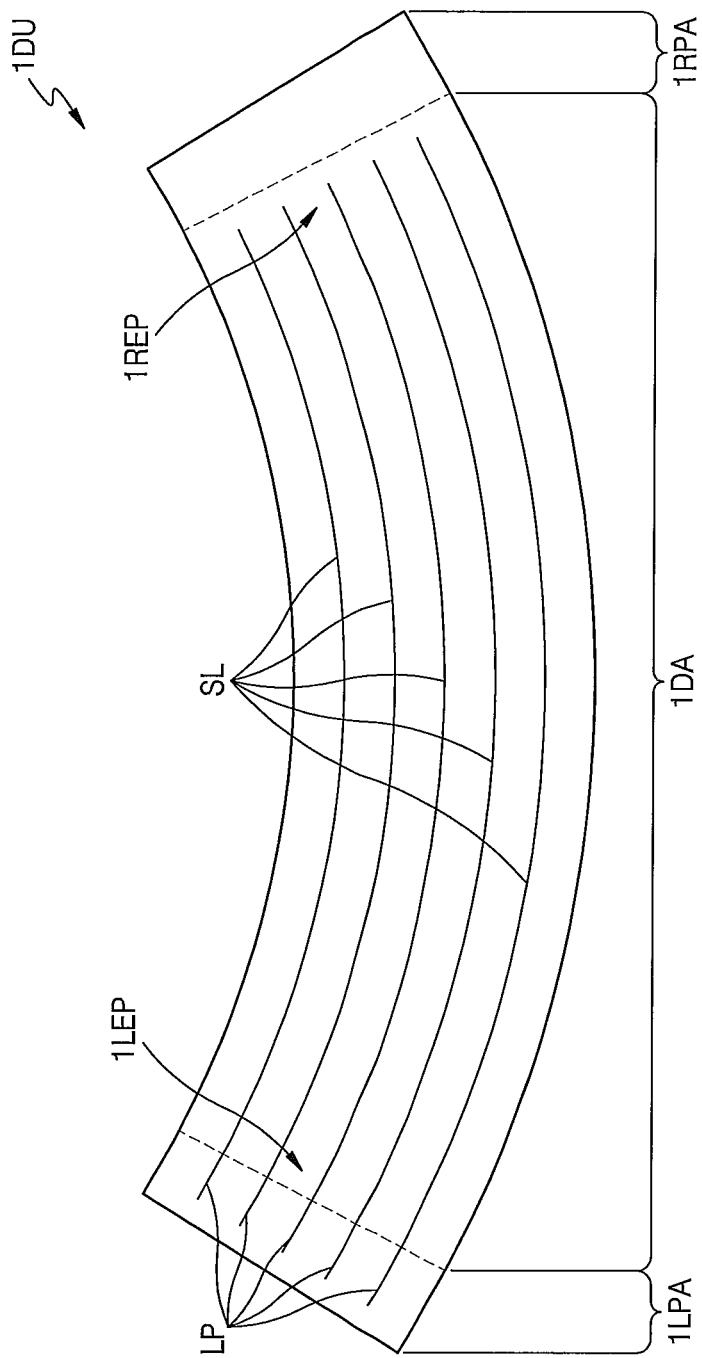
FIG. 4 is a plan view schematically illustrating scan lines in the intermediate product of FIG. 1.
Figure 5:
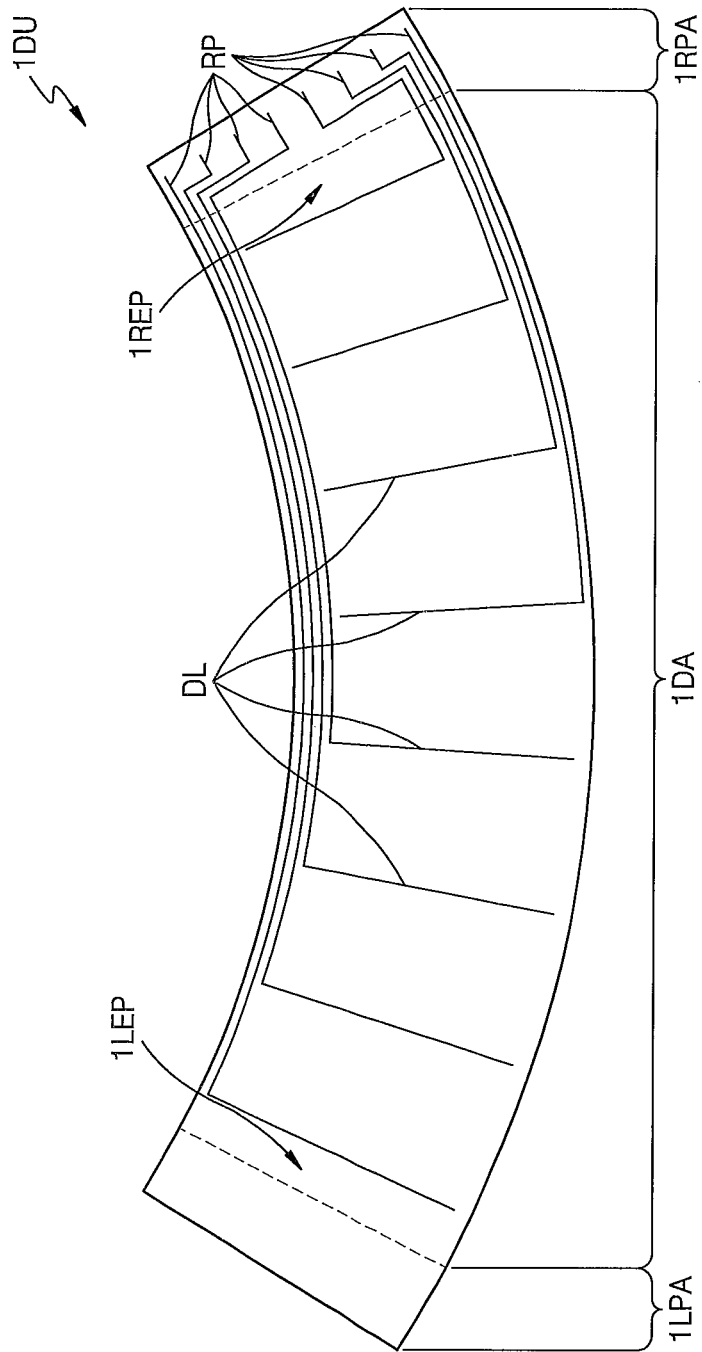
FIG. 5 is a plan view schematically illustrating data lines in the intermediate product of FIG. 1.

FIG. 4 is a plan view schematically illustrating scan lines SLs of the display device according to an embodiment. FIG. 5 is a plan view schematically illustrating data lines DLs of the display device according to an embodiment.

As illustrated in FIG. 4, the SLs extending from the 1LEP to the 1REP may be arranged in the 1DA to be spaced apart from each other. The SLs are electrically connected to first left pads LPs located in the 1LPA. As illustrated in FIG. 5, data lines DLs extending in a direction substantially perpendicular to the direction in which the SLs extend may be located in the 1DA to be spaced apart from each other. The DLs pass through edges of upper and lower end portions of the 1DA or upper and lower end portions outside the 1DA and then electrically connected to first right pads RPs located in the 1RPA. The SLs and the DLs are located in different layers so as not to contact each other. Since it is sufficient for the LPs to be electrically connected to the SLs, the LPs may be located in the same layer as the SLs or in a different layer from the SLs. Furthermore, since it is sufficient for the RPs to be electrically connected to the DLs, the RPs may be located in the same layer as the DLs or in a different layer from the DLs.

As described above, a scan signal or a data signal may be generated by the driver IC mounted on the first PCB and applied to the 1DA. The first PCB having the driver IC mounted thereon may be electrically connected to the LPs and the RPs.

Figure 6:
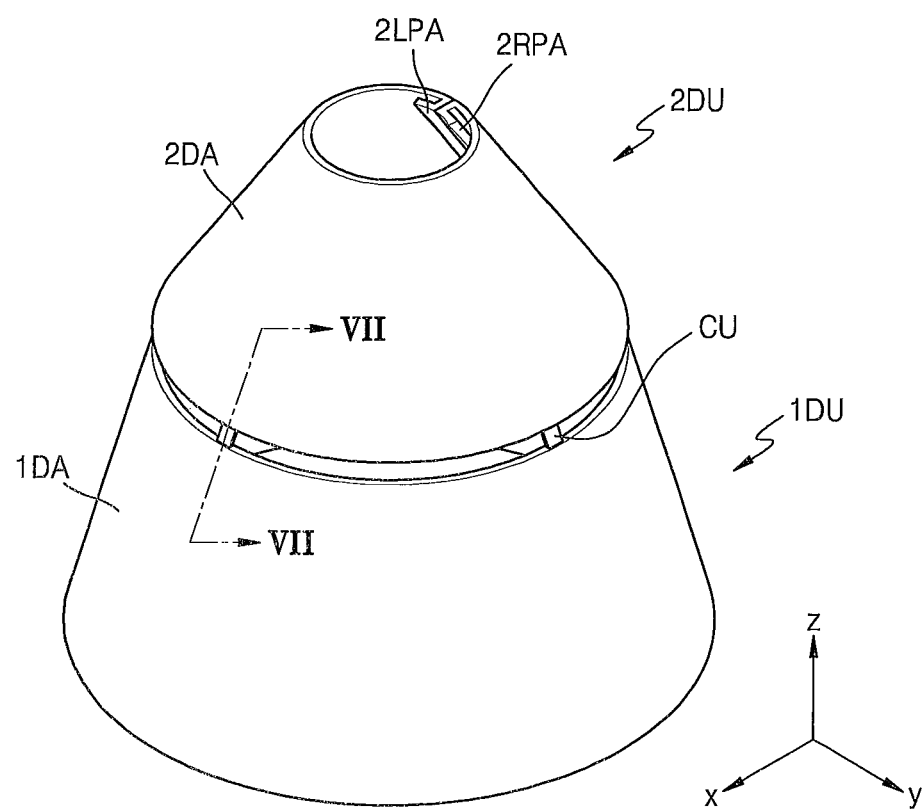
FIG. 6 is a perspective view schematically illustrating a display device according to another embodiment.
Figure 7:
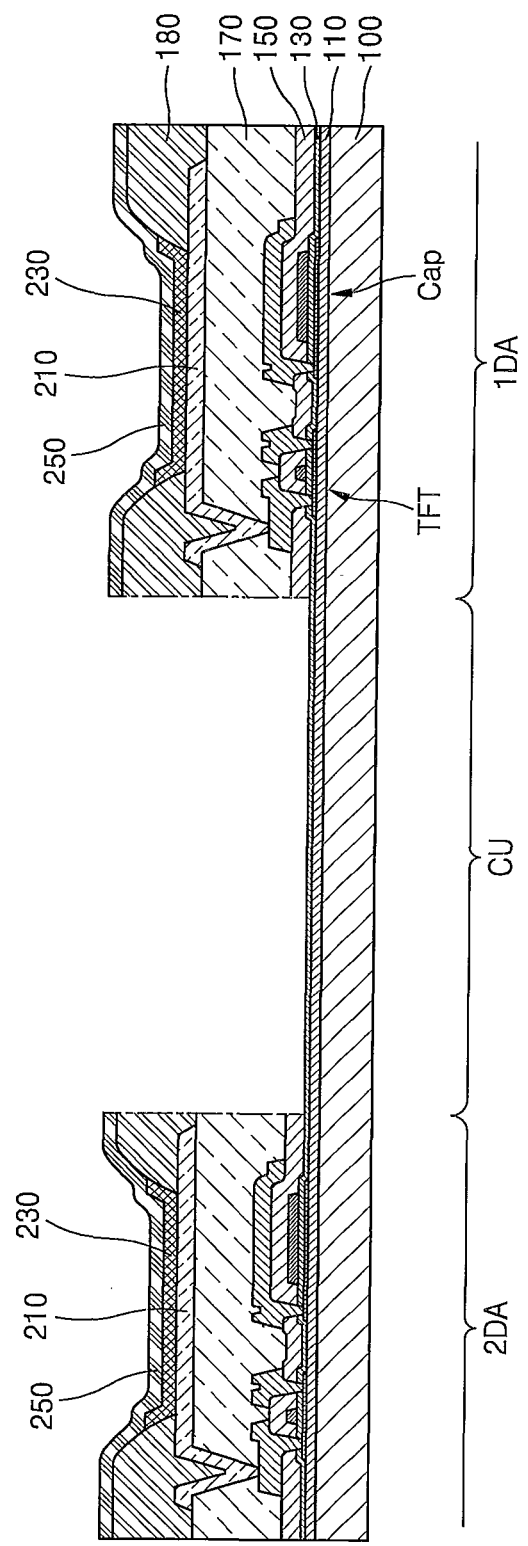
FIG. 7 is a cross-sectional view taken along a line VII-VII of FIG. 6.

FIG. 6 is a perspective view schematically illustrating a display device according to another embodiment. FIG. 7 is a cross-sectional view taken along a line VII-VII of FIG. 6.

In some embodiments, as illustrated in FIG. 6, the display device further includes a second display unit 2DU and a second PCB (not shown). The 2DU may have a similar shape to the shape of the 1DU. In other words, the 2DU may include a second display area 2DA, a second left pad area 2LPA, and a second right pad area 2RPA. The 2DA displays an image and thus the 2DU may include a display device in the 2DA. An image may be displayed in the entire surface of the 2DA or in part of the 2DA.

The 2LPA is located outside a second left end portion 2LEP (see FIG. 8) of the 2DA. The 2RPA is located outside a second right end portion 2REP (see FIG. 8) of the 2DA opposite to the 2LEP. Pads for receiving external electrical signals to be applied to the 2DA may be located in the 2LPA and the 2RPA.

As such, the 2DU has a bent shape as illustrated in FIG. 6. For example, the 2DU is bent between the 2DA and the 2LPA, and the 2DA and the 2RPA. As the 2DA is bent, the 2LEP and the 2REP of the 2DA are adjacent to each other and the 2LPA and the 2RPA are located inside the 2DU. The 2DU is located above the 1DU in a +z-axis direction, as illustrated in FIG. 6, forming an overall external shape of the display device with the 1DU.

The 2DU may be bent at least twice at portions between the 2DA and the 2LPA, and between the 2DA and the 2RPA, similarly to the 1DU illustrated in FIG. 3. Accordingly, a rear surface of the 2LPA and a rear surface of the 2DA may face each other. Likewise, a rear surface of the 2RPA and the rear surface of the 2DA may face each other. The second PCB corresponds to both the 2LPA and the 2RPA, similarly to the first PCB illustrated in FIG. 3.

As such, the display device according to the present embodiment has a 3D shape in a 3D space, unlike a typical display device. Accordingly, a display device having a 3D shape may be embodied so that viewers located at various positions may simultaneously see the 3D-shaped display surface of the display device. Various types of display devices having a 3D shape may be embodied through the 2DU having a shape different from the shape of the 1DU.

Various electrical signals may be applied to the 2DA. For example, a scan signal or a data signal is applied to the 2DA. The scan signal or the data signal may be generated by the driver IC and applied to the 2DA. In some embodiments, the driver IC is mounted on the second PCB and a signal from the driver IC is transferred to the 2LPA and the 2RPA located inside the 2DU having a 3D shape, via the second PCB, so as to be applied to the 2DA. The second PCB may contact both the 2LPA and the 2RPA. In this case, since the second PCB is also located inside the 2DU, the outside viewers may recognize only the 2DA displaying an image roughly around 360 degrees.

When the display device having a 3D shape as illustrated in FIG. 2 is manufactured by manufacturing the 1DU that is flat and flexible and bending part of the 1DU, the 1DU needs to maintain the shape as illustrated in FIG. 2. Such a function may be handled by the first PCB.

When the display device having a 3D shape as illustrated in FIG. 6 is manufactured by manufacturing the 2DU that is flat and flexible and bending part of the 2DU, the 2DU needs to maintain the shape as illustrated in FIG. 6. Such a function may be handled by the second PCB.

In other words, the second PCB may be bonded to each of the 2LPA and the 2RPA, by using, for example, ACF. As such, as the second PCB is bonded to each of the 2LPA and the 2RPA, a state in which the 2DA is bent may be maintained as illustrated in FIG. 6.

As the first PCB is located inside the 1DU, the second PCB is also located inside the 2DU and thus the first PCB and the second PCB may form a single body. In other words, as the 2LPA and the 2RPA are located above the 1LPA and the 1RPA as illustrated in FIG. 6, the first PCB and the second PCB may form a single body.

Like the 1DU illustrated in FIGS. 4 and 5, the 2DU may include scan lines, data lines, scan pads, and data pads, and descriptions thereof are omitted herein.

When the 2DU is located above the 1DU in the +z-axis direction, the display device according to the present embodiment includes a connection unit or connector CU connecting the 2DU to the 1DU. The 1DU and the 2DU may be kept spaced apart from each other by a preset gap by the CU. The preset gap may be, for example, about 100 nm to several hundreds of nanometers, which is described later. As illustrated in FIG. 6, the CU may include a first connection unit and a second connection unit so as to connect the 1DU and the 2DU at a plurality of positions.

In the display device according to the present embodiment, the 1DU may include a first substrate (not shown), the 2DU may include a second substrate (not shown), and the CU may include a third substrate (not shown) connecting the first substrate and the second substrate. The first to third substrates may form a single body as illustrated in FIG. 7. In other words, as illustrated in FIG. 7, a substrate 100 that is a single body may include the 1DA, the 2DA, and an inter-area between the 1DA the 2DA. A portion for the 1DA of the substrate 100 may be a part of the 1DU. A portion for the 2DA of the substrate 100 may be a part of the 2DU. The inter-area of the substrate 100 may be a part of the CU.

FIG. 7 illustrates a case in which both of the 1DU and the 2DU have an organic light-emitting device as a display device. Each of the 1DU and the 2DU may have a structure in which a thin film transistor (TFT) and a capacitor (Cap) are arranged on the substrate 100 to control the operation of a display device. A buffer layer 110 for preventing intrusion of impurities into a semiconductor layer of the TFT, a gate insulation film 130 for insulating the semiconductor layer of the TFT from a gate electrode, an interlayer insulation film 150 for insulating a source electrode/a drain electrode of the TFT from the gate electrode, a planarization film 170 covering the TFT and having an upper surface that is roughly flat, and other constituent elements may be located on and above the substrate 100. An organic light-emitting device including a pixel electrode 210, a counter electrode 250, and an intermediate layer 230 provided between the pixel electrode 210 and the counter electrode 250 and having a light-emitting layer may be located in the above-described stack structure. A pixel defining film 180 covering an edge of the pixel electrode 210 may be provided in the stack structure.

The CU may not include a display device such as an organic light-emitting device and may not include the TFT and the capacitor Cap, as illustrated in FIG. 7. However, as illustrated in FIG. 7, the CU may include the buffer layer 110 or the gate insulation film 130 in addition to the substrate 100. The CU may include an interlayer insulation film 150 or other insulation layers, as necessary. Furthermore, the CU may include a wiring for transferring electrical signals when transfer of electrical signals between the 1DU and the 2DU is needed.

Figure 8:
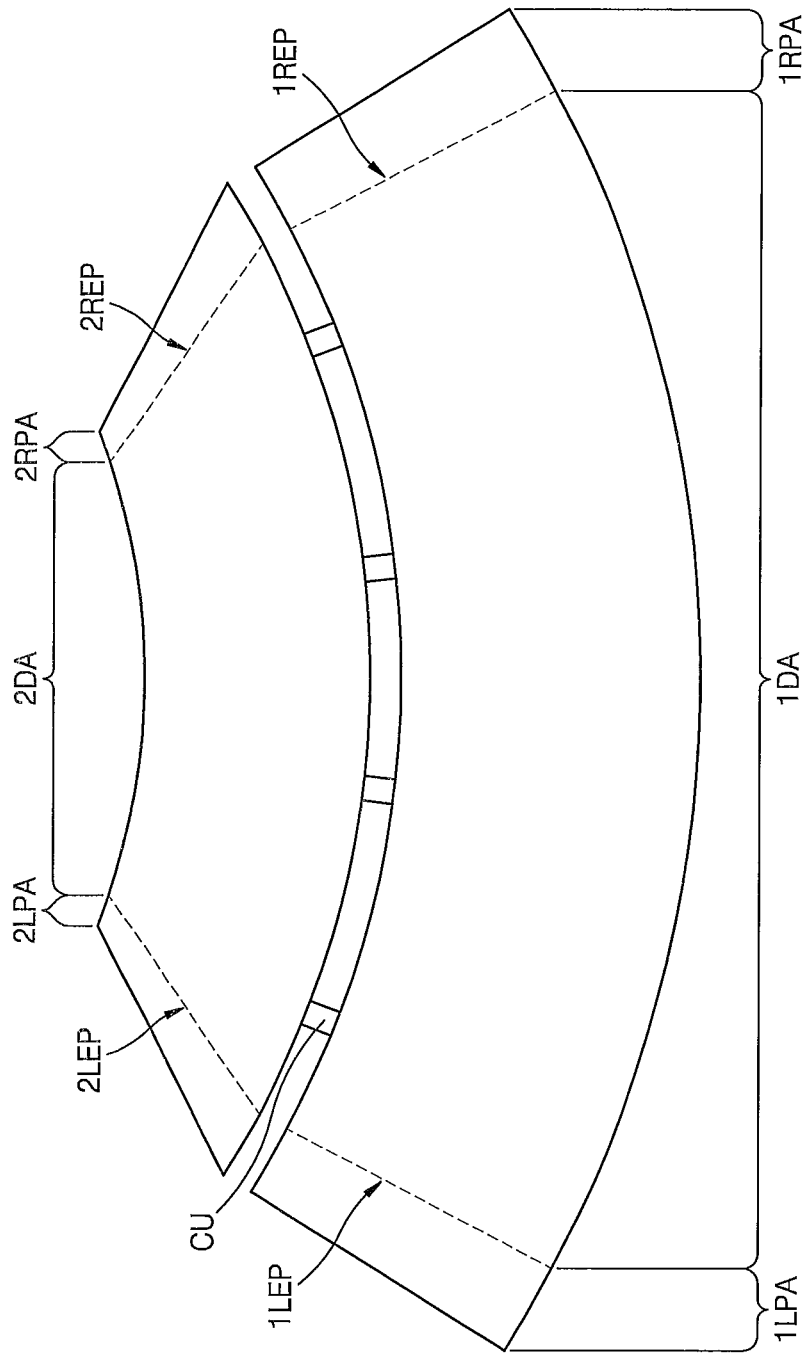
FIG. 8 is a plan view schematically illustrating an intermediate product when the display device of FIG. 6 is manufactured.

When the display device having a 3D shape, which includes the 1DU, the 2DU, and the CU, is manufactured, an intermediate product as illustrated in FIG. 8 may be used. In some embodiments, the display device is not manufactured in a 3D shape as illustrated in FIG. 6, from the beginning. The display device having a 3D shape as illustrated in FIG. 6 may be manufactured by manufacturing the 1DU and the 2DU, which are flat and flexible, and the CU connecting the 1DU and the 2DU, as illustrated in FIG. 8, and bending parts of the 1DU and the 2DU so that the 1LEP and the 1REP of the 1DA may be adjacent to each other and the 2LEP and the 2REP of the 2DA may be adjacent to each other. Accordingly, since the process of forming a display device has no big difference from the process of manufacturing a flat display device according to the related art, the display device having a 3D shape may be embodied by an easy manufacturing method.

In forming the intermediate product as illustrated in FIG. 8, the 1DU and the 2DU may be, or may not be, manufactured by being spaced apart from each other from the beginning. The intermediate product as illustrated in FIG. 8 may be formed by manufacturing the 1DU and the 2DU having no separation space between the 1DU and the 2DU and then removing all constituent elements including the substrate 100 by irradiating a laser beam onto a remaining portion except for a portion that will become the CU between the 1DU and the 2DU. As such, an interval between the 1DU and the 2DU may be accurately controlled, for example, about 100 nm to several hundreds of nanometers by using laser ablation technology (LAT).

Although FIG. 6 illustrates that the display device includes the 1DU and the 2DU, that is, a total of two display units, the present disclosure is not limited thereto. For example, a display device according to another embodiment may include four or more display units. In this case, the connection units connecting the respective display units may be located in a zigzag shape.

For example, when a display unit at the lowermost end is referred to as a first display unit and a display unit at the uppermost end is referred to as a fourth display unit, a second display unit and a third display unit are located between the first display unit and the fourth display unit, and the second display unit is located closer to the first display unit than to the third display unit, considering a geodesic line on the second and third display units connecting a first connection unit connecting the first display unit and the second display unit and a second connection unit connecting the third display unit and the fourth display unit, a third connection unit connecting the second display unit and the third display unit may be located at a position other than a position on the geodesic line. As a result, overall mechanical strength of the display device having a 3D shape may be improved.

As described above, according to at least one of the above-described embodiments, a display device having a 3D shape, which is easy to manufacture, may be embodied. It will be appreciated that the scope of the present invention is not limited to the effect.

It should be understood that embodiments described herein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope as defined by the following claims.

What is claimed is:

1. A display device comprising:
a first display unit comprising a first display area, a first left pad area outside a first left end portion of the first display area, and a first right pad area outside a first right end portion of the first display area, wherein the first right end portion is opposite to the first left end portion, wherein the first display unit is bent at a first portion between the first display area and the first left pad area and bent at a second portion between the first display area and the first right pad area, wherein the first display area is bent such that the first left and right end portions are adjacent to each other, and wherein the first left and right pad areas are located inside the first display unit; and
a first printed circuit board positioned over at least a portion of both the first left and right pad areas.

2. The display device of claim 1, wherein the first and second portions are bent such that a rear surface of the first left pad area and a rear surface of the first display area face each other and a rear surface of the first right pad area and the rear surface of the first display area face each other.

3. The display device of claim 2, wherein the first printed circuit board contacts both the first left and right pad areas.

4. The display device of claim 3, wherein the first printed circuit board is bonded to each of the first left and right pad areas so as to maintain a state in which the first display area is bent.

5. The display device of claim 1, further comprising:
a second display unit comprising a second display area, a second left pad area outside a second left end portion of the second display area, and a second right pad area outside a second right end portion of the second display area, wherein the second right end portion is opposite to the second left end portion, wherein the second display unit is bent at a third portion between the second display area and the second left pad area and bent at a fourth portion between the second display area and the second right pad area, wherein the second display area is bent such that the second left and right end portions are adjacent to each other, and wherein the second left and right pad areas are located inside the second display unit; and
a second printed circuit board positioned over at least a portion of both the second left and right pad areas.

6. The display device of claim 5, wherein the third and fourth portions are bent such that a rear surface of the second left pad area and a rear surface of the second display area face each other and a rear surface of the second right pad area and the rear surface of the second display area face each other.

7. The display device of claim 5, wherein the second printed circuit board contacts both the second left and right pad areas.

8. The display device of claim 7, wherein the second printed circuit board is bonded to each of the second left and right pad areas so as to maintain a state in which the second display area is bent.

9. The display device of claim 5, wherein the first and second printed circuit boards form a single body.

10. The display device of claim 5, further comprising a connection unit connecting the first and second display units,
wherein the first and second display units are arranged to maintain a first interval.

11. The display device of claim 10, wherein the connection unit comprises a first connection unit and a second connection unit connecting the first and second display units at different positions.

12. The display device of claim 10, wherein the first display unit comprises a first substrate, wherein the second display unit comprises a second substrate, and wherein the connection unit comprises a third substrate that connects the first substrate and the second substrate.

13. The display device of claim 12, wherein the first, second and third substrates form a single body.

14. The display device of claim 1, further comprising a plurality of first left pads electrically connected to scan lines in the first display area arranged in the first left pad area and a plurality of first right pads electrically connected to data lines in the first display area arranged in the first right pad area.

15. A display device comprising:
a first display unit comprising a first display area, a first left pad area and a first right pad area, wherein the first display area has a first partially cone shape and configured to display a first image in 360 degrees, and wherein the first left and right pad areas contact each other and are located at an inner surface of the first display area; and
a first printed circuit board connected to the first left and right pad areas.

16. The display device of claim 15, wherein the first printed circuit board directly contacts both the first left and right pad areas.

17. The display device of claim 15, further comprising:
a second display unit comprising a second display area, a second left pad area and a second right pad area, wherein the second display area has a second partially cone shape and is smaller than the first display area, wherein the second display area is configured to display a second image in 360 degrees, wherein the second left and right pad areas contact each other and are located at an inner surface of the second display area, and wherein a bottom portion of the second display unit is connected to a top portion of the first display unit such that the combined first and second display units have a substantially cone shape; and
a second printed circuit board connected to the first left and right pad areas.

18. The display device of claim 17, wherein the second printed circuit board directly contacts both the second left and right pad areas.

19. The display device of claim 17, further comprising a connector connecting the first and second display units such that the bottom portion of the second display unit does not directly contact the top portion of the first display unit.

20. The display device of claim 17, wherein the first and second images are different from each other.

* * * * *